United States Patent [19]

Yamamoto

[11] Patent Number: 5,379,252
[45] Date of Patent: Jan. 3, 1995

[54] MEMORY DEVICE
[75] Inventor: Makoto Yamamoto, Tokyo, Japan
[73] Assignee: Yozan Inc., Tokyo, Japan
[21] Appl. No.: 43,540
[22] Filed: Apr. 6, 1993
[30] Foreign Application Priority Data
  Apr. 7, 1992 [JP] Japan .................. 4-113956
[51] Int. Cl.[6] .................. G11C 11/34; H01L 29/68
[52] U.S. Cl. .................. 365/183; 365/222; 377/57; 377/59
[58] Field of Search .................. 365/183, 222; 377/45, 377/57, 58, 59, 63

[56] References Cited

U.S. PATENT DOCUMENTS

| | | | |
|---|---|---|---|
| 3,974,485 | 8/1976 | Witte | 377/57 |
| 4,024,512 | 5/1977 | Amelio et al. | 365/183 |
| 4,077,446 | 2/1977 | Elmer et al. | 377/59 |
| 4,202,046 | 5/1980 | Ward | 377/58 |
| 4,209,852 | 6/1980 | Hyatt | 365/222 |
| 4,258,376 | 3/1981 | Shannon | 377/63 |
| 4,675,847 | 6/1987 | Birnbaum et al. | 365/183 |
| 5,239,565 | 8/1993 | Imai | 365/58 |

OTHER PUBLICATIONS

Kiuchi, Yuji, "Basis and Practice of a Image Sensor", vol. 1, pp. 118–128, printed in Nikkankogyu–Shinbunsha.
Restandardizing Circuit for Analogue CCD Shift Register, IBM Technical Disclosure Bulletin, vol. 20, No. 1, pp. 379–382, Jun., 1977.
Cake, et al., Waveform Digitizer Snares Single-Shot Events at 1.348 Gsamples/s; Electronic Design, vol. 34, No. 6, pp. 123–124; 126, March, 1986.

Primary Examiner—Eugene R. LaRoche
Assistant Examiner—Tan Nguyen
Attorney, Agent, or Firm—Cushman, Darby & Cushman

[57] ABSTRACT

The present invention provides a memory device for realizing an analog memory or a multilevel memory that is easy to produce and requires only small scale circuitry. The memory device comprises: a CCD array "Ai" linearly arranged; a refresh circuit "R" connected to a CCD on one end of the CCD array; a shaping circuit connected to a CCD on another end of the CCD array; a feedback line "FL" for connecting an output of the shaping circuit to an input of the refresh circuits; and a topology difference clock line "CL" for transmitting data of the CCD array.

4 Claims, 2 Drawing Sheets

MEMORY DEVICE

FIELD OF THE INVENTION

The present invention relates to a memory device, especially to that effective for storing analog data or multilevel data.

BACKGROUND OF THE INVENTION

The reason why a digital computer has made progress as a programmable computer is due to the decrease in size and the increase in capacity of a digital memory. But recently, it appears that the limit has been reached in producing high density digital LSI: the development of a digital computer has its limit without doubt. Conventionally, large scale circuitry and complicated production processes are needed in order to realize a memory in analog or in multilevel.

SUMMARY OF THE INVENTION

The present invention solves the above-mentioned problems by providing a memory device for realizing an analog memory that is or a multilevel memory easy to produce and requires only small scale circuitry.

A memory device related to this invention holds a plural number of analog data by circulating data on a linear CCD array. A refresh circuit is set for inputting data on the beginning point along with a shaping circuit for preventing corrupted data in this memory device.

As such, is possible to realize an analog memory or a multilevel memory that is easy to produce and which utilizes small scale circuitry.

PREFERRED EMBODIMENT OF THE PRESENT INVENTION

Hereinafter, an embodiment of the memory device according to this invention is described with reference to the attached drawings.

Figure 1:
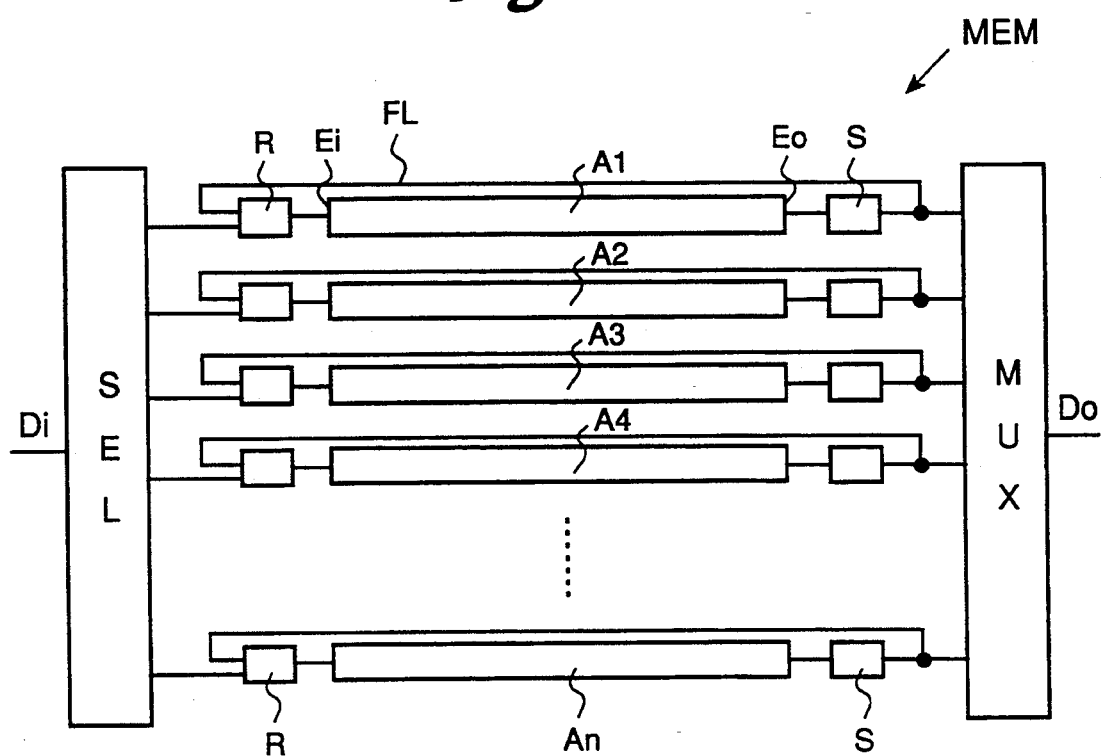
FIG. 1 shows a block diagram of an embodiment of the memory device according to this invention.
Figure 2:
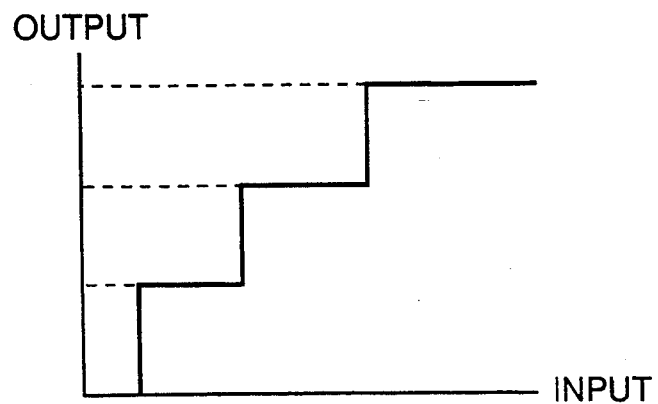
FIG. 2 shows a graph of characteristics of the shaping circuit in the embodiment.

FIG. 1 shows the outline of the memory device. The memory device MEM comprises a plural number of CCD arrays from "A1" to "An" to each of which is connected a refresh circuit "R" on the end of input "Ei" and a shaping circuit "S" on the end of output "Eo". Refresh circuit "R" provides to the CCD at the end of input Ei the electrical charge corresponding to input data Di. Shaping circuit S adjusts data output from output end Eo. This is the level adjustment of data to be fedback to the end of input. It is a "level shift circuit" in analog memory, and a "multilevel A/D converter" in multilevel memory as shown in FIG. 2. The data feedback from, the end of output Eo to the input end Ei is performed through feedback line FL.

Figure 3:
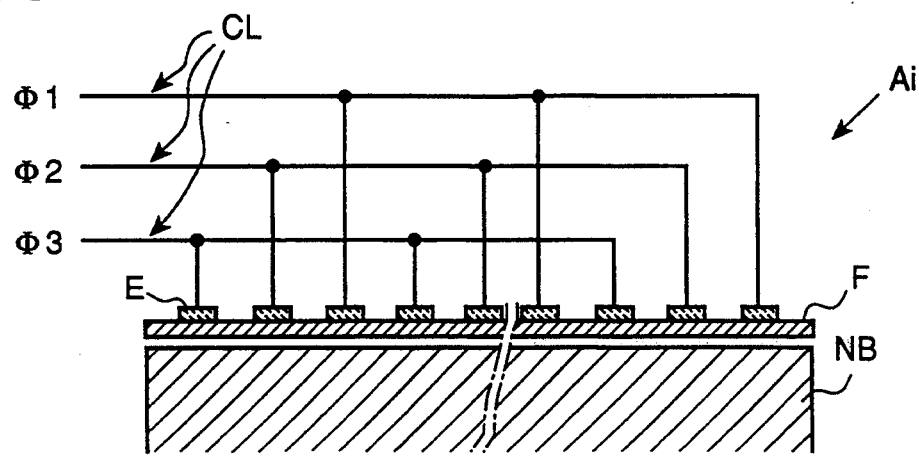
FIG. 3 shows the outline of the structure of CCD array.
Figure 4:
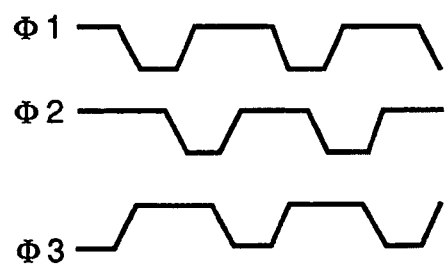
FIG. 4 shows a timing chart of clocks to be input to the CCD array.

A CCD array Ai is constructed as in FIG. 3. Film "F" is formed from $SiO_2$ on n-type board NB. A plurality of electrodes "E" are arranged on the film F. Each electrode E corresponds to one held datum: different topology from $\Phi 1$ to $\Phi 3$ (shown in FIG. 4) are input from topology differential clock line CL to the adjacent three electrodes. These clocks transmit a small number of carriers stored in a potential well to outer side by minus voltage of adjacent electrodes.

The structure of the CCD is much simpler than the cell of an ordinal DRAM, and requires less of an area for storing one analog datum.

Input data is given to each CCD array Ai through the selector SEL, and output data Do of each CCD array is selectively output through multiplexer MUX. When a memory device is accessed in random, data is transmitted on the CCD array after a CCD array is selected. The necessary data is transmitted to the CCD on input end Ei when data is written, and is transmitted to the CCD on out put end Eo when data is read. The maximum time for this transmission can be calculated by multiplying one cycle of transmission time to the number of CCD in one CCD array. As such, it is possible to decrease the number of CCD of each CCD array, or decrease the number of transmission cycles for random access, so as to shorten the access time by setting a plural number of CCD array.

Figure 5:
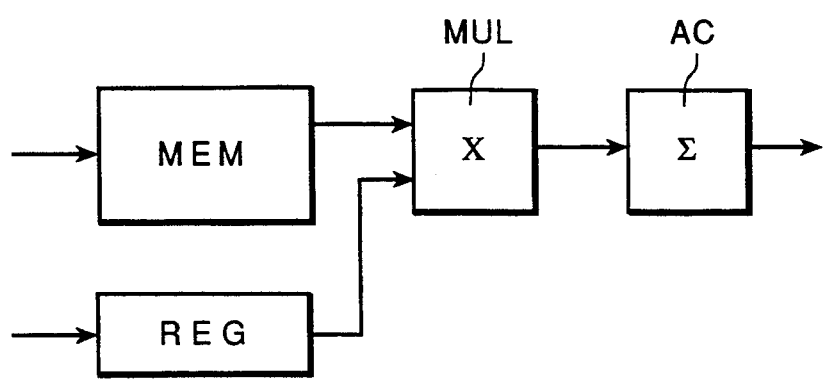
FIG. 5 shows a block diagram of a neural device using the memory device of this invention.

FIG. 5 shows a block diagram of the neural device using the above-mentioned the memory device MEM. The output of memory device and the data of register REG is input a to multiplication means MUL. The multiplication of them is calculated. The output of multiplication means MUL is input to accumulator AL and the accumulation is performed. Usually, the accumulation be low is necessary for the computation of neural network.

$$\Sigma(Wi \times Ai)$$

Wi: weight
Ai: input

It is calculated by the circuit in FIG. 5. Randon, access is not necessary because the order of the data for this computation is fixed, and weight data corresponding to input data stored in the memory device is read in order. That is, the merit of the memory device described above can be used effectively.

As mentioned, a memory device according to this invention holds a plural number of analog data by circulating data on linear CCD arrays. A refresh circuit is set for inputting data at the beginning point and a shaping circuit prevents poor quality data into the memory device. Therefor, it is possible to realize an analog memory or multilevel memory, which is easy to produce and whose circuit is small.

What is claimed is:

1. A memory device comprising:
    a plurality of CCD arrays operating independently from each other and arranged in parallel, wherein each of said CCD arrays is composed of a plurality of CCD's arranged linearly;
    a refresh circuit connected to a first end of each one of said CCD arrays;
    a shaping circuit connected to a second end of each one of said CCD arrays;
    a feedback line for connecting an output of each said shaping circuit to, an input of a corresponding refresh circuit for each of said CCD arrays;
    a selector for inputting data into said input of said refresh circuit of a selected one of said CCD arrays;

a multiplexer for outputting data from said output of said shaping circuit of a selected one of said CCD arrays; and a phase difference clock line for transmitting data of said plurality of CCD arrays.

2. A two-dimensional memory device comprising:

a plurality of CCD arrays operating independently from each other and arranged in parallel, wherein each of said CCD arrays is composed of a plurality of CCD's arranged linearly;

means for selecting and inputting data into a selected one of said plurality of CCD arrays;

means for propagating data through each of said plurality of CCD arrays; and means for selecting and outputting data from a selected one of said plurality of CCD arrays.

3. A two-dimensional memory device according to claim 2, wherein said propagation means comprises a phase difference clock.

4. A two-dimensional memory device comprising:

a plurality of CCD arrays operating independently from each other and arranged in parallel, wherein each of said CCD arrays is composed of a plurality of linearly arranged CCDs storing electrical charges which represent data;

means, connected to each of said CCD arrays, for refreshing said electrical charges representing data; and means, connected to each of said CCD arrays, for adjusting a level of said electrical charges representing data;

means for selecting and inputting data into a selected one of said plurality of CCD arrays;

means for propagating data through each of said plurality of CCD arrays; and means for selecting and outputting data from a selected one of said plurality of CCD arrays.

* * * * *